Nov. 8, 1960 J. B. SCHULTZ 2,959,640

PUSH-PULL AMPLIFIER CIRCUITS

Filed May 28, 1958

INVENTOR.
JOHN B. SCHULTZ
BY
W. H. Sprouagle
ATTORNEY

United States Patent Office 2,959,640

Patented Nov. 8, 1960

2,959,640

PUSH-PULL AMPLIFIER CIRCUITS

John B. Schultz, Folcroft, Pa., assignor to Radio Corporation of America, a corporation of Delaware Filed May 28, 1958, Ser. No. 738,446

9 Claims. (Cl. 179—1)

Figure 1:
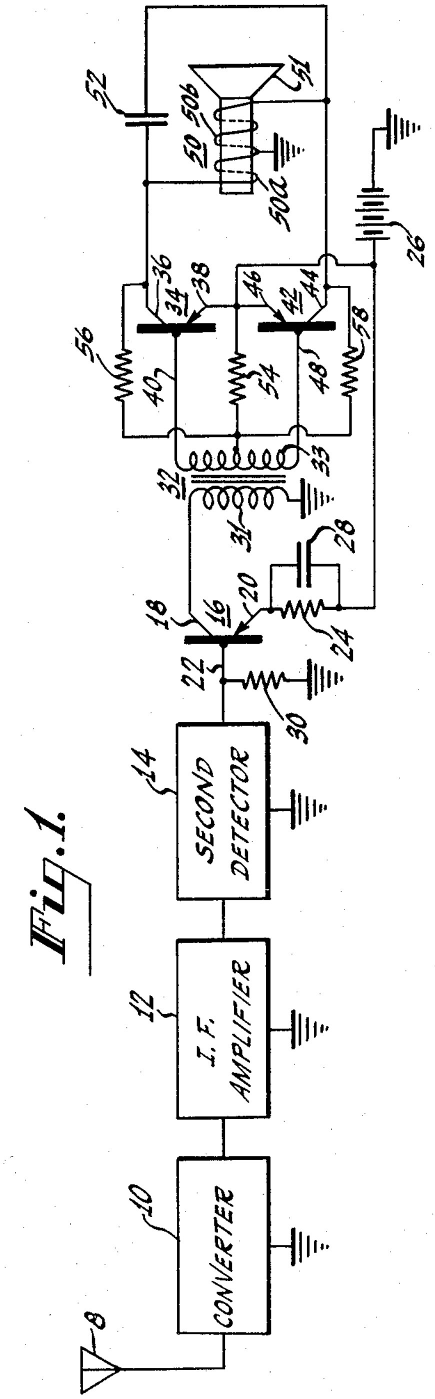

This invention relates to audio amplifier circuits of the push-pull type, and particularly to transistor class B push-pull circuits suitable for use as the audio output amplifiers of radio receivers and the like.

Transistor push-pull amplifier circuits are of two general types. One of these types, the so-called balanced type, employs transistors of the same conductivity type. This type circuit generally requires the use of an output transformer and an input transformer to provide the proper phase relationships for push-pull operation. The other type of transistor push-pull circuit is referred to as a complementary push-pull amplifier. This type amplifier uses transistors of opposite conductivity types, is single ended, and does not require either an input or an output transformer. While possessing this very great advantage, care must be taken to select the transistors used so that their characteristics match very closely. Otherwise, the circuit will be unbalanced and its operating characteristics will not be entirely satisfactory. Thus, in those instances where opposite conductivity transistors are not available, or economic or other reasons prevent the careful selection of matching transistors, the balanced type push-pull amplifier circuit may be preferred. The present invention is directed to an improved push-pull amplifier of the latter type, that is, an amplifier using like conductivity transistors. Unlike the usual push-pull amplifier of this type, however, circuits embodying the present invention do not require an output transformer.

Thus, it is an object of the present invention to provide an improved push-pull amplifier circuit of the balanced type which does not require an output transformer.

One of the problems encountered in the design of a transistor amplifier circuit is occasioned by the tendency of a transistor's operating point to vary. This variation in the operating point may be caused by variations in ambient temperature, by variations in transistor parameters, and by changes in the supply voltage. The operating point variations result in unsatisfactory circuit operation and may cause distortion, which is undesirable. Stabilization circuits for transistor push-pull amplifier circuits are well known. Generally, however, these stabilization circuits require the use of temperature compensating elements such as thermistors or semi-conductor diodes, both of which are relatively costly. Other circuits use conventional resistance type biasing networks, which usually introduce undesirable signal degeneration and thus reduce the gain of the amplifier.

It is, accordingly, another object of this invention to provide an improved circuit for stabilizing the operating point of a transistor balanced push-pull amplifier circuit.

It is yet another object of the present invention to provide an improved transistor push-pull amplifier circuit which does not require an output transformer and wherein stable operation is provided with minimum signal distortion.

A balanced push-pull transistor amplifier circuit embodying the invention includes a pair of transistors of the same conductivity type connected in the common emitter configuration. The output or collector electrodes of the transistors are connected to the terminals of a center-tapped loudspeaker voice coil, thus eliminating the usual output transformer. The direct current voltage variations across the resistance of the voice coil have been found, according to the invention, to be of the proper polarity and of sufficient magnitude to stabilize the circuit operation. These voltage variations are applied to the base electrodes of the transistors through feedback circuits in such a manner that stabilization of the operating point is achieved without introducing degenerative signal feedback into the circuit operation.

Figure 2:
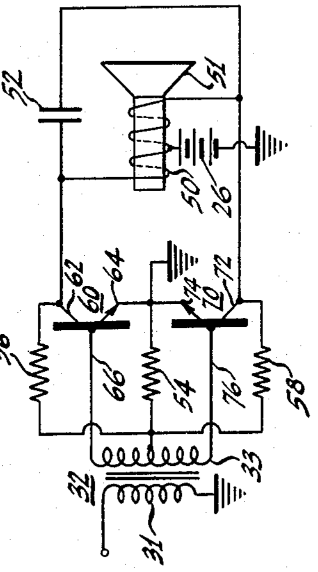

The novel features that are considered characteristic of this invention are set forth with particularity in the appended claims. The invention itself, however, both as to its organization and method of operation, as well as additional objects and advantages thereof, will best be understood from the following description when read in connection with the accompanying drawings, in which:

Figure 1 is a schematic circuit diagram, partially in block diagram form, of a radio receiver including an audio output circuit embodying the present invention; and Figure 2 is a schematic circuit diagram of a transistor push-pull amplifier circuit suitable for use in the receiver of Figure 1 and embodying the invention.

Referring now to the drawing wherein like parts are indicated by like reference numerals in both figures, and referring particularly to Figure 1, a radio receiver includes an antenna 8, which receives radio frequency carrier wave signals and couples these signals to a signal converter 10. The converter 10 could be a single transistor connected to generate a local oscillator signal and to mix the oscillator signal with the received radio frequency signal or it could comprise separate oscillator and mixer transistors. In addition, the converter stage could be preceded by a separate radio frequency amplifier stage as is conventional. The intermediate frequency signal developed by the heterodyning of the local oscillator signal and the received radio frequency signal by the converter 10 is applied to an intermediate frequency (I.F.) amplifier 12. The amplified I.F. signal is applied to a second detector 14, which is operative to separate the modulation components from the carrier wave signal to provide an audio frequency signal. The audio frequency signal is applied to the base 22 of an audio frequency driver transistor 16. The transistor 16 may be considered to be a junction transistor of the P-N-P type and includes, in addition to the base 22, a collector 18 and an emitter 20.

To provide biasing voltages for the driver transistor 16, its emitter 20 is connected through a degenerative stabilizing resistor 24 to the positive terminal of a direct current biasing supply battery 26, the negative terminal of which is grounded. Signal degeneration across the stabilizing resistor 24 is prevented by connecting a signal by-pass capacitor 28 in shunt with the stabilizing resistor 24. A base biasing resistor 30 is connected between the base 22 and ground. The collector 18 or output electrode of the transistor 16 is connected through the primary winding 31 of a coupling transformer 32 to ground. The coupling transformer 32 includes a secondary winding 33.

One terminal of the transformer secondary winding 33 is connected to the base electrode 40 of one output transistor 34 while the other terminal of the secondary winding 33 is connected to the base 48 of a second output transistor 42. The transistors 34 and 42, which are connected to operate as a class B push-pull amplifier, are of the same conductivity type and may be considered to be junction transistors of the P-N-P type. The transistor 34 includes a collector 36 and an emitter 38 in addition to the base 40, and the transistor 42 includes a collector 44 and an emitter 46 in addition to the base 48. To supply forward biasing potentials for the transistors 34 and 42, their emitters 38 and 46, respectively, are connected to the positive terminal of the biasing supply battery 26.

The collector or output electrodes of the transistors 34 and 42 are connected, in accordance with the invention, to the terminals of a center-tapped voice coil 50 of a loudspeaker 51. The center tap of the voice coil is connected to ground. To short out higher harmonic frequency signals and thus minimize crossover distortion, the loudspeaker voice coil 50 is shunted by a capacitor 52. The emitters 38 and 46 of the output transistors are connected through a resistor 54 to a center tap on the secondary winding 33 of the coupling transformer 32. To stabilize the operating point of the circuit, in accordance with the invention, the collectors 36 and 44 of the respective push-pull transistors 34 and 42 are connected through feedback resistors 56 and 58, respectively, to the center tap on the secondary winding 33.

In operation, the signal on the base 40 of the output transistor 34 will, at any instant, be equal in amplitude but out-of-phase with the signal on the base 48 of the other output transistor 42 because of the push-pull input transformer connection. If the signal on the base 40 is negative, for example, the transistor 34 will conduct current and signal current will flow from the collector through one side (the left half 50*a*) of the loudspeaker voice coil 50 to ground. The other output transistor 48 will be non-conductive during this half cycle of operation. On the next half cycle of operation, the signal on the base 40 will be positive while the signal on the base 48 will be negative. Accordingly, the transistor 42 will be conductive and signal current will flow through the other half (the right half 50*b*) of the loudspeaker voice coil 50. During this half cycle of operation the first transistor 34 will be cut-off. The result is a push-pull output signal across the loudspeaker voice coil 50. While, in order to apply a quiescent bias to the transistors 34 and 42, direct current is permitted to flow in the loudspeaker voice coil, the direct current in the two sections of the voice coil 50 magnetizes the speaker's magnet in opposite directions so that the net magnetization is zero.

Direct current collector flow of each of the output transistors 34 and 42 provides a voltage drop across the resistance present in each half of the loudspeaker voice coil 50. These voltage drops are used, in accordance with the invention, to stabilize the quiescent operating point of the circuit. Assume, for example, that the collector current of the transistor 34 increases for any reason, such as because of an increase in ambient temperature, the substitution of a transistor having different parameters in the circuit, or a variation in the battery supply voltage. This increased collector current flow will provide a voltage drop across the resistance of the voice coil 50 between the collector 36 and ground making the collector 36 less negative. That is to say, an increase in collector current of the transistor 34 will provide a decrease in collector voltage of that transistor, by virtue of the direct-current voltage drop across the loudspeaker voice coil 50. This decrease in voltage is applied through the feedback circuit, including the resistor 56 and the upper half of the secondary winding 33, to the base 40 of the output transistor 34. The forward base-emitter voltage of the transistor 34 therefore decreases, thus decreasing the collector current of this transistor. Accordingly, the original increase of collector current is compensated by the feedback circuit. While direct current feedback is provided for stabilization purposes, degenerative A.C. signal feedback to the base electrodes is minized. This results because the resistance of the resistor 54 is chosen to be relatively small, especially as compared to the input impedance of the transistors plus the impedance of the transformer secondary winding 33.

It is also to be noted that the feedback resistor 58 stabilizes the operating point of the transistor 42 in a manner similar to the stabilization of the transistor 34. In addition, a decrease in collector current for any reason will provide an increase in collector voltage by virtue of the decreased direct current drop across the resistance of the voice coil 50. This will increase the forward bias and increase the collector current to compensate for the original decrease in collector current. Thus, the feedback circutis serve to maintain the collector current of the output transistors constant despite either an original increase or decrease in collector current.

A circuit employing the following values for the various circuit components has been built and successfully operated in a radio receiver:

| | |
|---|---|
| Transistors 34 and 42 | RCA Type 2N406. |
| Battery 26 | 4.5 volts. |
| Loudspeaker voice coil 50 | Total resistance, 128 ohms, (64 ohms per side). |
| Resistors 54, 56 and 58 | 100; 5,600; and 5,600 ohms, respectively. |
| Capacitor 52 | 0.5 microfarad. |

In Figure 2, a push-pull amplifier circuit of the same general type as the output amplifier of the receiver of Figure 1 includes a pair of transistors 60 and 70 which may be considered to be junction transistors of the N-P-N type, that is of an opposite conductivity type to the transistors used in the receiver of Figure 1. The one transistor 60 includes a collector 62, an emitter 64 and a base 66. The other transistor 70 includes a collector 72, an emitter 74 and a base 76. A difference in the circuit of Figure 2 is that the positive terminal of the battery 26 is connected through respective halves of the speaker voice coil 50 to the collectors 62 and 72 of the output transistors 60 and 70 rather than to the emitters as in Figure 1. The emitters 64 and 74 of the output transistors are connected to ground, which is the other, or negative, terminal of the supply battery. In other respects, the circuit of Figure 2 is similar to the output circuit of the receiver of Figure 1 and operates in the same manner but with opposite polarity voltages.

Push-pull transistor amplifier circuits embodying the invention are relatively simple in construction, yet reliable in operation. The usual output transformer is eliminated in these circuits and the voice coil of the receiver loudspeaker is used as the output load impedance. The voltage variations across the speaker voice coil provide a means for stabilizing the quiescent operating bias of the circuits without the need for special compensating elements. Thus, circuits embodying the invention provide satisfactory operating point stabilization at a minimum cost.

What is claimed is:

1. A class B push-pull amplifier circuit comprising, in combination, a pair of transistors each including base, emitter and collector electrodes, transformer means for applying input signals to the base electrodes of said transistors, load impedance means for said transistors including a loudspeaker voice coil having a pair of terminals, means connecting one of said terminals with the collector electrode of one of said transistors, means connecting the other of said terminals with the collector electrode of the other of said transistors, means providing a direct-current bias supply source having a pair of terminals, means connecting an intermediate point of said voice coil with one of the terminals of said source, means connecting the emitter electrodes of said transistors with the other terminal of said source, means connecting said emitter electrodes with an intermediate point of said transformer means, and stabilizing means providing variation in the base-emitter voltage of said transistors in response to variation of direct current through said voice coil comprising direct current feedback means connected between the collector electrodes of said transistors and said intermediate point of said transformer means.

2. In a radio receiver, a class B push-pull audio output circuit comprising, in combination, a pair of transistors of the same conductivity type each including base, emitter and collector electrodes, transformer means including a secondary winding connected with the base electrodes of said transistors for applying push-pull input signals thereto, a loudspeaker including a voice coil having a resistance component and including a pair of terminals, means connecting one of said terminals with the collector electrode of one of said transistors, means connecting the other of said terminals with the collector electrode of the other of said transistors, means providing a direct-current bias supply source having a pair of terminals, means connecting an intermediate point of said voice coil with one of the terminals of said source, means connecting the emitter electrodes of said transistors with the other terminal of said source, means connecting said emitter electrodes with an intermediate point of said secondary winding, and direct-current resistive feedback means connected directly between the collector electrodes of said transistors and said intermediate point of said secondary winding to provide negative direct-current feedback to said base electrodes and operating point stabilization of said transistors.

3. A class B push-pull amplifier circuit comprising, in combination, a pair of transistors of the same conductivity type each including base, emitter and collector electrodes, transformer means for applying input signals to said transistors including a secondary winding having a pair of terminals, means connecting one of said terminals with the base of one of said transistors, means connecting the other of said terminals with the base of the other of said transistors, a loudspeaker including a voice coil having a resistance component and including a pair of terminals, means direct-current conductively connecting one of said terminals of said voice coil with the collector electrode of said one of said transistors, means direct-current conductively connecting the other of said terminals of said voice coil with the collector electrode of said other of said transistors, means providing a direct-current bias supply source having a pair of terminals, means connecting an intermediate point of said voice coil with one of the terminals of said source, means connecting the emitter electrodes of said transistors with the other terminal of said source, means including a resistor connecting said emitter electrodes with an intermediate point of said secondary winding, first resistive feedback means connected between the collector electrode of said one of said transistors and said intermediate point of said secondary winding, and second resistive feedback means connected between the collector electrode of said other of said transistors and said intermediate point of said secondary winding, said first and second feedback means being operative to provide direct current negative feedback to said base electrodes and operating point stabilization of said transistors.

4. A class B push-pull amplifier circuit as defined in claim 3 wherein the resistance of said resistor is small relative to the input impedance of said transistors to minimize signal feedback through said first and second feedback means.

5. In a radio receiver, an audio output circuit comprising a pair of transistors of the same conductivity type each including base, emitter, and collector electrodes and connected for class B push-pull common emitter operation, output load impedance means for said transistors comprising a center-tapped loudspeaker voice coil connected with said collector electrodes and providing direct collector voltage variations in response to direct collector current variations of said transistors, an input transformer including a center-tapped secondary winding connected with the base and emitter electrodes of said transistors for applying an input signal therebetween, and direct-current operating point stabilization means for said transistors including a direct current feedback circuit connected between the collector and base electrodes of each of said transistors to vary the base-emitter voltage thereof in response to said collector current variations.

6. In a radio receiver a class B push-pull audio output circuit comprising, in combination, a pair of transistors of the same conductivity type each including base, emitter and collector electrodes, transformer means for applying input signals to said transistors including a secondary winding having a pair of terminals, means connecting one of said terminals with the base of one of said transistors, means connecting the other of said terminals with the base of the other of said transistors, a loudspeaker including a voice coil having a first and a second terminal, direct-current conductive means connecting said first terminal with the collector electrode of one of said transistors, direct-current conductive means connecting said second terminal with the collector electrode of the other of said transistors, a third terminal for said voice coil connected to the mid-point thereof, said voice coil providing resistance in said circuit between said first and third terminal and between said second and third terminal of a magnitude to provide direct collector voltage variations for said transistors in response to variations in direct collector current, means providing a direct-current bias supply source having a pair of terminals, direct-current conductive means connecting said third terminal of said voice coil with one of the terminals of said source, direct-current conductive means connecting the emitter electrodes of said transistors with the other terminal of said source, a first resistor direct-current conductively connecting said emitter electrodes with an intermediate point of said secondary winding means, a second resistor directly connected between the collector of said one of said transistors and said intermediate point to provide direct-current negative feedback to the base of said one of said transistors in response to voltage variations between said first and third terminals, and a third resistor directly connected between the collector of said other of said transistors and said intermediate point to provide direct-current negative feedback to the base of said other of said transistors in response to voltage variations between said second and third terminals.

7. In a radio receiver, the combination defined in claim 6 wherein the resistance of said first resistor is larger than the resistance of said voice coil and smaller than the input impedance of said transistors, and the resistance of said second and third resistors are substantially equal.

8. In a radio receiver, a class B audio output circuit comprising, in combination, a pair of transistors of the same conductivity type each including base, emitter and collector electrodes, a transformer including a secondary winding for applying input signals in push-pull to the base electrodes of said transistors, a loudspeaker including a voice coil providing a resistive direct current load for said transistors and including a pair of terminals, means connecting one of said terminals with the collector electrode of one of said transistors, means connecting the other of said terminals with the collector electrode of the other of said transistors, means providing a direct-current bias supply having a pair of terminals, means connecting an intermediate point of said voice coil with one of the terminals of said source, means connecting the emitter electrodes of said transistors with the other terminal of said source, means connecting said emitter electrodes with an intermediate point of said secondary winding, and stabilizing means providing variation in the base-emitter voltage of said transistors in response to variation of direct current through said voice coil including a first resistor connected between the collector of said one of said transistors and said intermediate point and a second resistor connected between the collector of said other of said transistors and said intermediate point.

9. In a radio receiver a push-pull audio output circuit comprising, in combination, a pair of transistors of the same conductivity type each including a base, emitter and collector electrodes, input circuit means connected between the base electrodes of said transistors for applying push-pull input signals thereto, a loudspeaker including a voice coil having a resistance component and including a pair of terminals, means connecting one of said terminals with the collector electrode of one of said transistors, means connecting the other of said terminals with the collector electrode of the other of said transistors, means providing a direct current bias supply source having a pair of terminals, means connecting an intermediate point of said voice coil with one of the terminals of said source, means connecting the emitter electrodes of said transistors with the other terminal of said source, circuit means providing a direct current path between said emitter and base electrodes, and direct current responsive feedback means direct current conductively connected between the collector and base electrodes of each of said transistors to provide negative direct current feedback to said base electrodes and operating point stabilization of said transistors.

References Cited in the file of this patent

UNITED STATES PATENTS

| | | |
|---|---|---|
| 2,784,262 | Crow | Mar. 5, 1957 |
| 2,812,393 | Patrick | Nov. 5, 1957 |
| 2,847,519 | Aronson | Aug. 12, 1958 |
| 2,860,195 | Stanley | Nov. 11, 1958 |
| 2,863,008 | Keonjian | Dec. 2, 1958 |

FOREIGN PATENTS

| | | |
|---|---|---|
| 204,099 | Australia | Sept. 10, 1956 |
| 1,004,668 | Germany | Mar. 21, 1957 |